(12) United States Patent
Yoshida et al.

(10) Patent No.: US 9,379,267 B2
(45) Date of Patent: Jun. 28, 2016

(54) SOLAR CELL MODULE

(75) Inventors: Masaki Yoshida, Osaka (JP); Hidetoshi Kitaura, Osaka (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 423 days.

(21) Appl. No.: 13/880,378

(22) PCT Filed: Jun. 28, 2012

(86) PCT No.: PCT/JP2012/004204
§ 371 (c)(1),
(2), (4) Date: Apr. 19, 2013

(87) PCT Pub. No.: WO2013/001822
PCT Pub. Date: Jan. 3, 2013

(65) Prior Publication Data
US 2013/0206204 A1   Aug. 15, 2013

(30) Foreign Application Priority Data
Jun. 28, 2011   (JP) ................. 2011-142559

(51) Int. Cl.
*H02S 40/36* (2014.01)
*H01L 31/05* (2014.01)

(52) U.S. Cl.
CPC ........ *H01L 31/0508* (2013.01); *H01L 31/0504* (2013.01); *H01L 31/0516* (2013.01); *H02S 40/36* (2014.12); *Y02E 10/50* (2013.01)

(58) Field of Classification Search
CPC ... H01L 31/00; H01L 31/02; H01L 31/02021; H01L 31/02008; H01L 31/02013; H01L 31/0224; H01L 31/022425; H01L 31/04; H01L 31/042; H01L 31/05; H01L 31/0504; H01L 31/0508; H01L 31/0512; H01L 31/02002; H01L 31/0201; H01L 31/0465; H01L 31/02016
See application file for complete search history.

(56) References Cited

U.S. PATENT DOCUMENTS

2004/0016456 A1   1/2004   Murozono et al.
2004/0200522 A1*  10/2004  Fukawa .......... H01L 31/022425
                                                        136/259
(Continued)

FOREIGN PATENT DOCUMENTS

CN   201274292   7/2009
JP   02-235379   9/1990
(Continued)

OTHER PUBLICATIONS

English machine translation of Kim et al. (KR 2010-0135515) published Dec. 27, 2010.*
(Continued)

*Primary Examiner* — Christina Chern
(74) *Attorney, Agent, or Firm* — Wenderoth, Lind & Ponack, L.L.P.

(57) ABSTRACT

A solar cell module including two or more adjacent solar cells (1a, 1b), a connection member (2) for electrically connecting the solar cells (1a, 1b) to each other, and a solder layer (5) disposed between the solar cells (1) and the connection member (2), wherein first and second opening holes (4a, 4b) are formed at a connection portion of the connection member (2) corresponding to the first and the second solar cells (1a, 1b), the first and the second opening holes (4a, 4b) are configured that solder is deposited into them, and first and second protruding parts (3a, 3b) are formed at a part of the outer periphery of each of the first and second opening holes (4a, 4b) of the connection member (2). By the present invention, it is possible to ensure sufficient thickness of the solder joining layer and to improve reliability for long-term use.

13 Claims, 8 Drawing Sheets

(56) References Cited

U.S. PATENT DOCUMENTS

| | | |
|---|---|---|
| 2005/0268959 A1 | 12/2005 | Aschenbrenner et al. |
| 2007/0295381 A1* | 12/2007 | Fujii ............... H01L 31/022433 |
| | | 136/244 |
| 2008/0041437 A1 | 2/2008 | Yamaguchi |
| 2009/0183759 A1 | 7/2009 | Hishida |
| 2011/0073165 A1 | 3/2011 | Lee |
| 2012/0012153 A1 | 1/2012 | Azechi et al. |
| 2012/0103385 A1* | 5/2012 | Hong .................. H01L 31/0504 |
| | | 136/244 |
| 2012/0312358 A1 | 12/2012 | Yamashita et al. |
| 2014/0150844 A1 | 6/2014 | Azechi et al. |

FOREIGN PATENT DOCUMENTS

| | | |
|---|---|---|
| JP | 08-298334 | 11/1996 |
| JP | 2006-245153 | 9/2006 |
| JP | 2008-502149 | 1/2008 |
| JP | 2008-028366 | 2/2008 |
| JP | 2008-235549 | 10/2008 |
| JP | 2008-543062 | 11/2008 |
| JP | 2009-130117 | 6/2009 |
| JP | 2009-176782 | 8/2009 |
| JP | 2010-182851 | 8/2010 |
| KR | 2010-0135515 | 12/2010 |
| WO | 2006/128204 | 12/2006 |
| WO | 2010/103998 | 9/2010 |
| WO | 2011/105510 | 9/2011 |

OTHER PUBLICATIONS

Extended European Search Report dated Feb. 12, 2014 for the related European Patent Application No. EP12805419.

International Search Report of PCT Application No. PCT/JP2012/004204 dated Jul. 31, 2012.

"Photovoltaic module reliability and its lifetime evaluation method" (Sadao Sakamoto), Applied Physics, vol. 79, No. 5 (2010), p. 400-443 together with its partial translation of p. 443.

"Pb-free solder material for Double-sided heat dissipation power module" (Zenji Sakamoto, Naohiko Hirano, Tomomi Okumura, Kaichi Tsuruta, Akiko Takagi), Proc. of the 15th Symposium on Microjoining and Assembly Technology in Electronics (2009), p. 95-100 together with its partial translation of chapter 4.

English translation of Search Report which is an annex to Office Action dated Jan. 29, 2015 for the corresponding Chinese Patent Application 20128003076.9.

* cited by examiner

FIG. 1

1a····FIRST SOLAR CELL
1b····SECOND SOLAR CELL
2 ····CONNECTION MEMBER

1a ··· FIRST SOLAR CELL　　1b ··· SECOND SOLAR CELL
3a ··· FIRST PROTRUDING PORTION　3b ··· SECOND PROTRUDING PORTION
4a ··· FIRST OPENING HOLE　　4b ··· SECOND OPENING HOLE
2　··· CONNECTION MEMBER

5 ··· WIRE SOLDER
6 ··· HEATING UNIT

| THICKNESS OF SOLDER JOINING LAYER | WITHOUT CRACKING | WITH CRACKING |
|---|---|---|
| 0 μm~10 μm | 1 SITE | 3 SITES |
| 10 μm~20 μm | 4 SITES | 1 SITE |
| 20 μm~ | 3 SITES | 0 SITE |

FIG. 10

SOLAR CELL MODULE

TECHNICAL FIELD

The present invention relates to a solar cell module in which a plurality of solar cells are electrically and mechanically joined to each other.

BACKGROUND ART

A solar cell is capable of directly converting solar light energy, which is clean and unlimited in supply, to electrical energy, and thus has been expected as a new energy source.

In general, because an electrical output of one sheet of a solar cell is small, a predetermined practical electrical output is generated from a solar cell module in which plural sheets of solar cells are connected to each other in a serial and parallel manner. The serial and parallel connection is performed by connecting a joining member to a negative electrode and a positive electrode.

In a double-sided electrode type solar cell in the related art, a plurality of thin wire electrodes (finger electrodes) that collect carriers and a connecting electrode (a bus bar electrode), which connects wiring materials are provided on a photoelectric conversion unit, and electrodes having a different polarity, that is, a P-type electrode and an N-type electrode, are provided on a front surface that is a light-receiving surface and a back surface, respectively. To form the solar cell module using the double-sided electrode type solar cell, it is necessary for a plurality of solar cells to be arranged in parallel and to be connected in series. However, at this time, it is necessary to join the front surface electrode, and the back surface electrode of an adjacent solar cell with a joining member.

In recent years, according to an increasing demand for further higher efficiency, development of a solar cell called a back contact type has been actively performed. In this solar cell, since back surfaces may be connected to each other when connecting a plurality of back contact type solar cells, a connection member is not provided on a front surface, light-receiving efficiency is improved, and external appearance becomes satisfactory. The P-type electrode and the N-type electrode are formed on the back surface of the back contact type, but the P-type electrode and the N-type electrode are configured to alternately enter between combs different from each other.

In this manner, the P-type electrode and the N-type electrode are alternately and densely formed. Due to this, carrier loss decreases, and thus high power generation efficiency is realized. Therefore, a factor of realizing high efficiency is to increase an area, in which the P-type electrode and the N-type electrode are present together, as much as possible.

Next, problems related to the reliability of the solar cell will be described below.

As reliability of the solar cell, generally, 90% or more of an initial value is guaranteed as the maximum output after 10 years, and 80% or more thereof is guaranteed as the maximum output after 20 years. However, accompanying an increase in an introduction amount of solar power generation, a phenomenon, which is not preferable from a reliability aspect, has obviously been occurring.

As an example, occurrence of a defective phenomenon called "hot spot" may be exemplified. This phenomenon is a heat generation phenomenon that occurs due to a difference in a generated output distribution at a part of solar cells and a module in a solar power generation system, and may cause significant damage to the system. Furthermore, it has been reported that occurrence of cracking of the solar cells is confirmed, or due to abnormal heat generation in a part of the solar cells and a connection casing, a solar cell surface is burned, or deformation and firing of the connection casing occurs.

Although various causes may be exemplified, it is considered that a joint failure between the solar cell and the joining member becomes one cause of the defective phenomenon (see, Patent Literature (hereinafter, abbreviated as PTL) 1, for example). Under a long-term use environment, when cracking extends at a solder joint portion between the solar cell and the joining member, power collection efficiency decreases, and thus a difference in a generated power distribution of the solar cell and the module occurs. Therefore, the heat generation phenomenon such as the hot spot occurs.

This joint failure becomes further significant in a solar cell of a thin substrate. For example, since a warpage state of the solar cell, which is caused by thermal stress during soldering of the above-described joining member mainly having a thickness of approximately 300 to 500 µm and less than 200 µm, increases, a joint failure such as electrode peeling-off easily occurs, and thus the reliability of the joint portion is further decreased.

In addition, electrons and holes, which are generated at the solder joint portion of the above-described back contact type solar cell, are proportional to an area of the joint portion, and a percentage of the electrons and holes, which are recoupled and thus disappear, increases. Therefore, the solder joint portion becomes an invalid power generation portion. To improve power generation efficiency of the back contact type solar cell, it is necessary to make the solder joint portion, which is an invalid power generation portion, relatively small, and to make the solder joint portion small, it is necessary to improve the reliability of each solder joint portion. As means for improving the reliability of the solder joint portion, when the thickness of a solder joining layer is controlled to be equal to or larger than a certain thickness and to be uniform, the reliability of the joint portion may be improved (see, NPL 2, for example).

In addition, in the joining between the solar cell and the joining member, a shape of the solar cell joining member and a joining method, which are configured to secure relatively higher reliability, are disclosed.

There is disclosed a method in which a concavo-convex shape is applied to the surface of the joining member, the joining member is uniformly heated due to the concavo-convex shape, and thus the joint portion having high reliability is accomplished (see, PTL 1, for example). When the concavo-convex shape is applied to the surface of the connection member, heating is easy and thus the joining between the solar cell and the joining member may be accomplished by treatment in a short time.

The reason is because an effective area of a covering material is further enlarged compared to a surface that is not treated, and thus when being heated with halogen or hot air, necessary heat may be obtained in a relatively easy and fast manner. When the covering material is uniform, the entirety of a layer is uniformly heated, and thus the joining between the solar cell and the joining member may be realized in a wide range.

In addition, a method in which a through-hole is provided to the joining member at a central position of the solder joint portion, a solder layer, which is positioned under the through-hole and on the electrode, is directly heated through the through-hole by a heating apparatus, and thus the joining member and the electrode are solder-joined is also disclosed (see, PTL 2, for example). Since the solar cell and the joining member are locally heated instead of heating the entirety thereof, a warpage state of the solar cell due to heat stress during soldering is mitigated, and thus shear stress at the joint portion is also mitigated. As a result, the reliability of the joint portion is improved. However, to secure the reliability of the joint portion, it is important to control the thickness of the joint portion or to reduce generation of voids by discharging a flux from the joint portion. However, this is not sufficient with a shape of the joining member in the related art.

CITATION LIST

Patent Literature

PTL 1
Japanese Translation of a PCT Application Laid-Open No. 2008-543062
PTL 2
Japanese Patent Application Laid-Open No. 2008-235549
PTL 3
Japanese Patent Application Laid-Open No. 2009-176782
PTL 4
Japanese Translation of a PCT Application Laid-Open No. 2008-502149
PTL 5
Specification of US Patent Application Laid-Open No. 2005/0268959
PTL 6
Japanese Patent Application Laid-Open No. HEI 8-298334
PTL 7
PCT International Publication No. WO 2011/105510
PTL 8
Specification of US Patent Application Laid-Open No. 2004/0016456

Non-Patent Literature

NPL 1
"Photovoltaic module reliability and its lifetime evaluation method" (Sadao Sakamoto), Applied Physics, Volume 79, No. 5 (2010), p 400-443
NPL 2
"Pb-free solder material for Double-sided heat dissipation power module" (Zenji Sakamoto, Naohiko Hirano, Tomomi Okumura, Kaichi Tsuruta, Akiko Takagi), Proc. of the 15th Symposium on Microjoining and Assembly Technology in Electronics (2009), p 95-100

SUMMARY OF INVENTION

Technical Problem

In the technology of applying the concavo-convex shape to the joining member disclosed in PTL 1, it is difficult to sufficiently secure the thickness of the joining layer. A conductive material is plated with a brazing filler metal in advance, and thus the thickness of the joining layer becomes substantially the same as a thickness after the plating. Commonly, a plating thickness is approximately 30 μm, and it is considered that the thickness of the joining layer is preferably approximately 50 μm from the viewpoint of reliability. In a case where a paste-shaped or wire-shaped solder is not added, the thickness of the joining layer is small, and thus the joint portion having high reliability may not be accomplished.

However, when the thickness of the joining layer exceeds 1 mm, during the joining and subsequent processes, the joining layer becomes a stress concentration site, thereby becoming a cause of occurrence of cracking of the solar cell. In addition, in a case where the solder is added, a volatilized flux is trapped inside the joining layer, thereby becoming a cause of occurrence of voids. As a result, the joint portion has low reliability.

In addition, in the joining member disclosed in PTL 2 of the related art, the through-hole is provided to the joining member, and thus the solder is heated with laser from the through-hole. In this case, it is difficult to provide the solder to a portion other than a portion irradiated with the laser in an amount that is sufficient to secure the required thickness of the joining layer.

In addition to this, various related technologies are disclosed (see, PTL 3 to PTL 8, for example).

For example, PTL 3 to PTL 5 disclose a solar cell module provided with a first solar cell, a second solar cell, and a connection member that electrically connects the first solar cell and the second solar cell to each other and has a notch that penetrates through the connection member from an upper surface to a lower surface thereof. When the notch is provided, stress that is applied to the solar cell module may be mitigated. However, the above-described notch is provided at a portion except for an electrical connection portion, and thus does not participate in the electrical connection. In addition, a protruding portion, which is formed at a part of the connection member of PTL 3 and protrudes toward the first and second solar cells, is disclosed. However, this protruding portion is also configured to mitigate the stress that is applied to the solar cell module, and does not participate in the electrical connection. Therefore, it is difficult to increase connection reliability between the connection member and the first and second solar cells according to the inventions disclosed in PTL 3 to PTL 5.

PTL 6 also discloses a connection member provided with the through-hole that penetrates through the connection member from an upper surface to a lower surface thereof. However, this through-hole is provided in order for a bonding wire and the solar cell not to interfere with each other, and is not configured to increase the connection reliability between the connection member and the solar cell. PTL 7 discloses a solar cell module provided with a wiring conductor having a protrusion that steeply erects from a part of the peripheral edge of an opening toward a solar cell element. However, this protrusion comes into direct contact with a power extraction electrode, and is not configured to increase the connection reliability between the solder layer and the solar cell. In addition, PTL 8 discloses a method of manufacturing a photoelectric conversion apparatus in which a protrusion provided at a part of a conductive material layer and an electrode of a spherical element come into direct contact with each other through soldering. However, PTL 8 does not imply a technology of increasing the connection reliability between a semiconductor element and the solder by constantly maintaining the thickness of the solder layer.

The invention has been made in consideration of the above-described problems, and an object thereof is to provide a solar cell module having reliability for long-term use by stably securing a sufficient thickness of a solder joining layer.

Solution to Problem

According to an embodiment of the present invention, there is provided a solar cell module including: two or more solar cells that are adjacent to each other; a connection member that electrically connects the solar cells to each other; and a solder layer that is disposed between the solar cells and the connection member.

The connection member has a first opening hole and a second opening hole which are formed at a connection portion of the connection member corresponding to a first solar cell and a second solar cell. The first opening hole and the second opening hole are configured so that solder is deposited into them.

A first protruding portion and a second protruding portion protruding toward the solar cell side are formed at a part of the outer periphery of each of the first opening hole and the second opening hole of the connection member.

According to this configuration, reliability of a solder joint portion between the solar cell and a joining member may be improved. It is preferable that the connection member include a plurality of protrusions of 50 μm to 1 mm to avoid generation of a stress concentration portion, which becomes a cause of cracking of the solar cell. The thickness of the solder joining layer may be controlled to be 50 μm or more.

Advantageous Effects of Invention

As described above, since in the solar cell connection member of the present invention, the sufficient thickness of the solder joining layer is stably secured, a solar cell module, which has reliability for long-term use over 20 years or more, may be provided.

DESCRIPTION OF EMBODIMENTS

Hereinafter, the present invention will be described in detail with reference to embodiments, but the present invention is not limited to the following embodiments. In the drawings, the same or similar reference numerals will be given to parts having the same or similar functions, and description thereof will not be repeated. However, the drawing is schematic. Accordingly, it is necessary to determine specific dimensions or the like by consulting the following description. In addition, it is needless to say that portions having dimensional relationships or ratio different in each case are included in the drawings.

Embodiments

Figure 1:
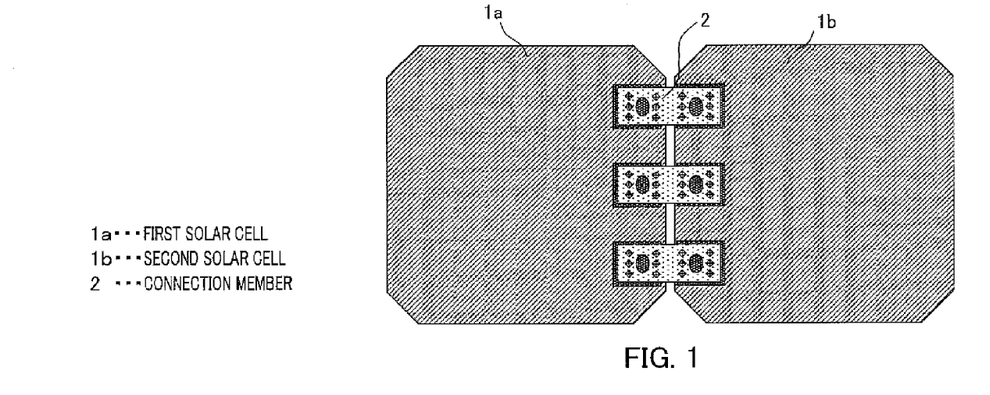
FIG. 1 is a top plan view of a solar cell module related to an embodiment.

FIG. 1 is a top plan view of a solar cell module related to this embodiment. Here, an example of a back contact type solar cell is described. As shown in FIG. 1, the solar cell module includes two solar cells 1a and 1b that are adjacent to each other, a rectangular plate-shaped connection member 2 that electrically and mechanically connects solar cells 1a and 1b to each other, and a solder layer that is disposed between each solar cell 1 and connection member 2.

Figure 2:
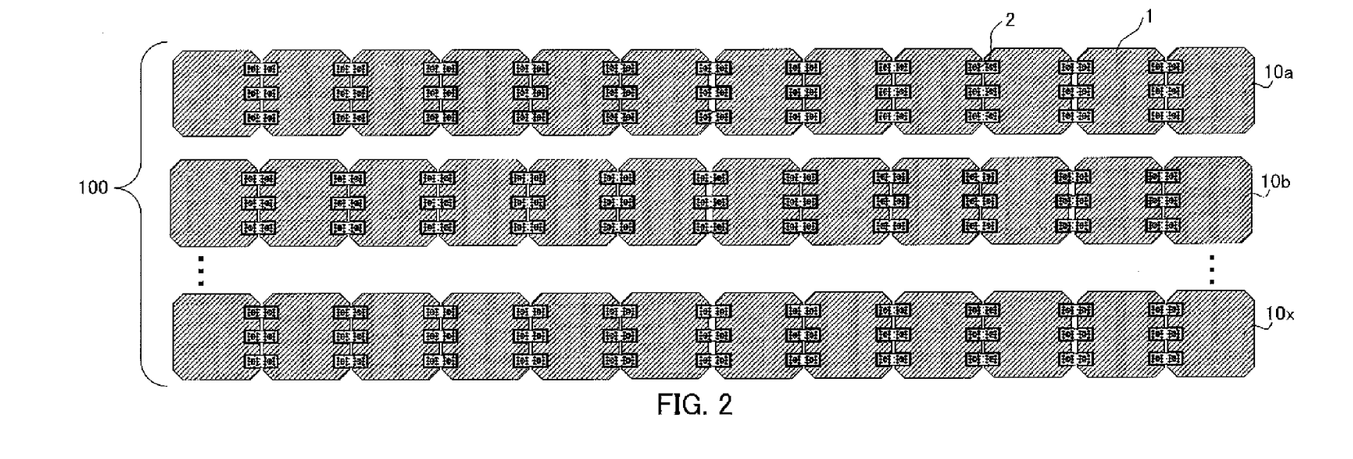
FIG. 2 is a top plan view of the solar cell module related to the embodiment.

As shown in FIG. 2, the solar cell module may be a type of string 10a in which a plurality of the solar cells are disposed in a straight line. In addition, the solar cell module may be a type of so-called module 100 in which a plurality of solar cell strings 10a, 10b, . . . , 10x are disposed in parallel, and both ends of the solar cell strings that are adjacent to each other are electrically and mechanically connected to each other by a transition wiring.

Here, "electrical connection" represents that for example, different polarities of solar cell 1a and solar cell 1b are connected via connection member 2 that is an electrical conduction member and a solder layer 5. "Physical connection" represents that for example, the solar cells are joined to each other to the extent that the solar cell module is capable of maintaining a shape as a solar cell module during manufacturing, conveying, and mounting thereof. In addition, "solar cell module" represents a member including two or more solar cells that are electrically connected to each other, and has a concept including a string type or a type in which a plurality of solar cell strings are disposed in parallel.

Figure 3A:
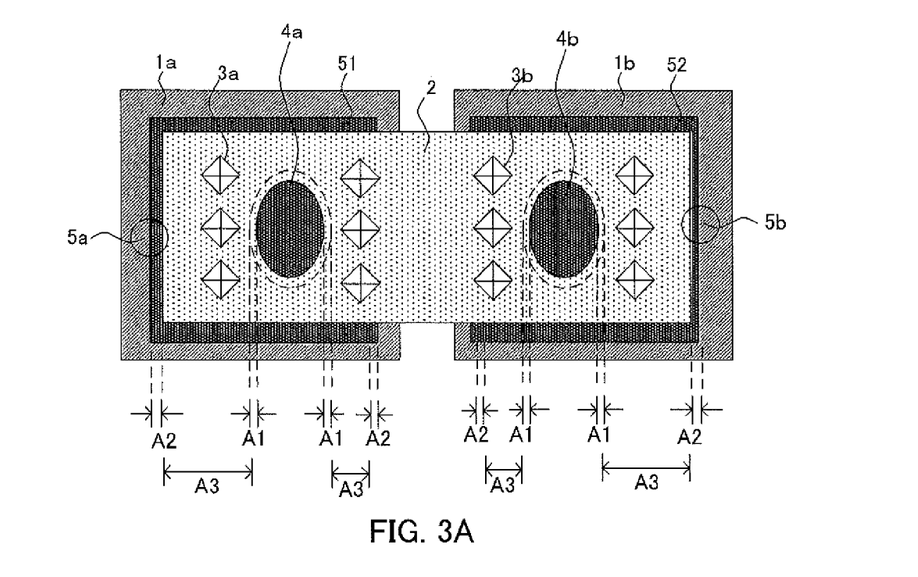
FIG. 3A is a top plan view of a connection portion of a solar cell module related to the embodiment.
Figure 3B:
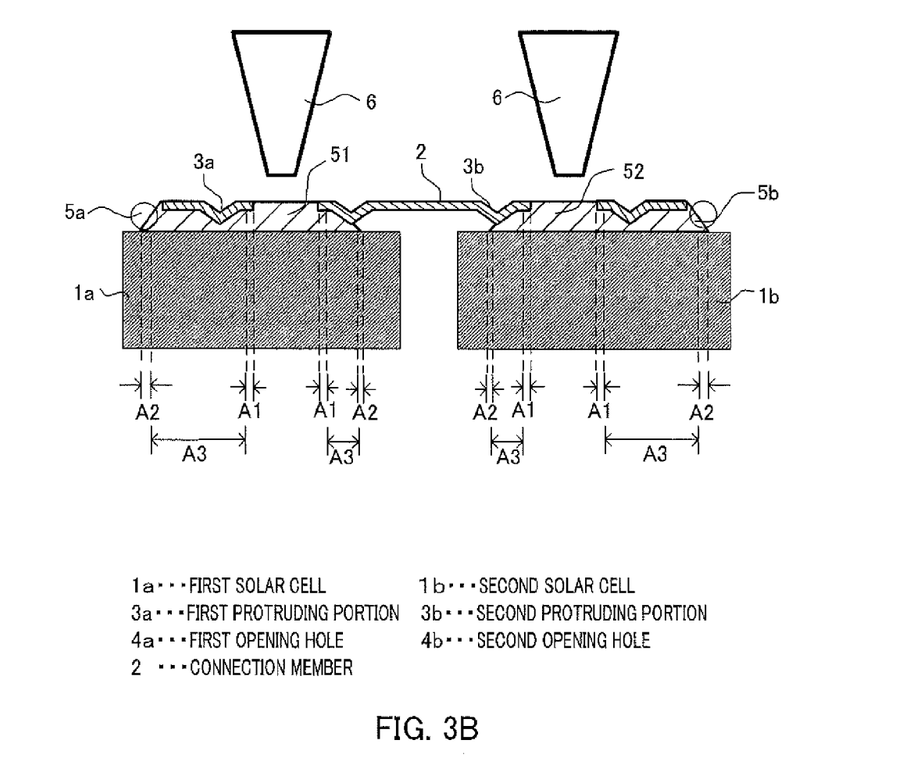
FIG. 3B is a cross-sectional diagram of the connection portion of the solar cell module related to the embodiment.

FIG. 3A is a top plan view of the connection portion of the solar cell module related to this embodiment. FIG. 3B is a cross-sectional view of the connection portion of the solar cell module related to this embodiment.

As shown in FIG. 3A, the connection member 2 has first opening hole 4a and second opening hole 4b which are formed at respective sites corresponding to connection portions between first solar cell 1a and second solar cell 1b along a longitudinal direction of connection member 2. First opening hole 4a and second opening hole 4b are configured to have solder deposited therein. In addition, as shown in FIG. 3B, first protruding portion 3a and second protruding portion 3b are formed toward solar cell 1 side at least at a part of the outer periphery of each of first opening hole 4a and second opening hole 4b. Here, first and second protruding portions 3a and 3b having a quadrangular pyramid shape are disposed in such a manner that each three pieces are arranged in a row in a direction orthogonal to the longitudinal direction of the string. This is because the connection member 2 may be stably disposed to the solar cell 1 by arranging each three pieces in a row. In addition, in each of first and second protruding portions 3a and 3b, the number of protruding portions is not limited to three, and may be several as long as stable disposition is possible.

Here, the "outer periphery" represents a region between the opening hole and a peripheral edge of the solder layer. To secure wetting and spreading of the solder that is injected from the opening hole, as shown in FIGS. 3A and 3B, it is preferable to provide the protruding portions so as to avoid peripheral edge A1 of the opening hole. In addition, to stably secure a sufficient thickness of the solder layer, it is preferable to provide the protruding portions in such a manner that the vertex of each of the protruding portions is close to the opening hole side in relation to a peripheral edge A2 of the wetting and spreading region of the solder layer. For example, the protruding portions may be provided in region A3 between the opening hole and the peripheral edge of the solder layer except for peripheral edge A1 and peripheral edge A2.

As shown in FIG. 3B, in solder layer 5 (51, 52), it is preferable that first solder layer 51 be continuously formed to range from first opening hole 4a to first protrusion portion 3a, and second solder layer 52 be continuously formed to range from second opening hole 4b to second protruding portion 3b to improve the connection strength between solar cells 1a and 1b and connection member 2.

A first fillet 5a of first solder layer 51 is formed at a part of the outer periphery of connection member 2. The first solder layer 51 is continuously formed to range from the first opening hole 4a to the first fillet 5a so as to be visibly protruding from beneath the connection member 2. In addition, the second fillet 52 of second solder layer 5 is formed at a part of the outer periphery of connection member 2. The second solder layer 52 is continuously formed to range from the second opening hole 4b to the second fillet 5b so as to be visibly protruding from beneath the connection member 2.

Due to the fillet, it is difficult for cracking to extend to the solder joining layer, and thus joining reliability is improved. In addition, when the fillet can be stably formed, fillet examination using a camera is applicable to examination of the connection portion, and thus examination in a process becomes easy. That is, in addition to improvement of joining strength, it is easy to discriminate whether or not solder layer 5 satisfactorily gets wet and spreads.

Figure 4A:
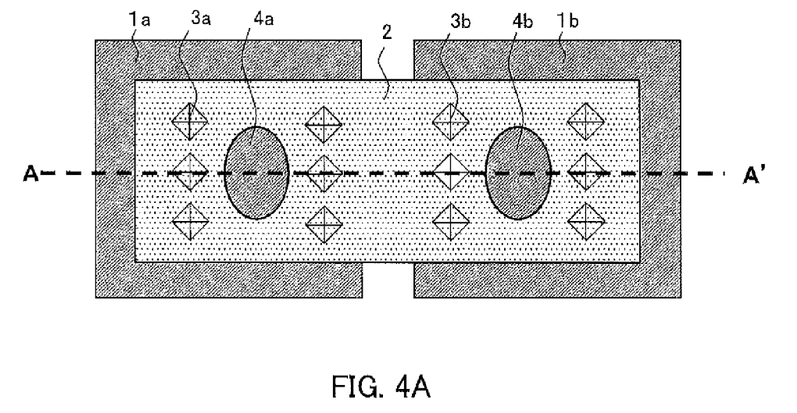
FIG. 4A is a top plan view illustrating a state in which solder is filled in the connection portion of the solar cell module related to the embodiment.
Figure 4B:
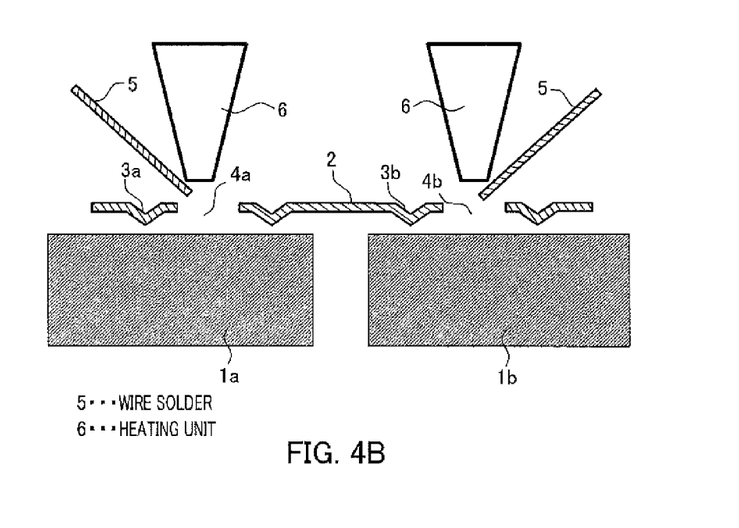
FIG. 4B is a cross-section view illustrating a state in which the solder is filled in the connection portion of the solar cell module related to the embodiment.

FIG. 4A is a top view illustrating a state in which solder is filled in the connection portion of the solar cell module related to the embodiment. FIG. 4B is a cross-section view illustrating a state in which the solder is filled in the connection portion of the solar cell module related to the embodiment.

As shown in FIG. 4A, it is preferable that first opening hole 4a and second opening hole 4b be formed in regions including the central line in a longitudinal direction of connection member 2, respectively to improve the connection strength between solar cells 1a and 1b and connection member 2. It is preferable that the center of first opening hole 4a and second opening hole 4b be positioned on the central line of connection member 2 in the longitudinal direction to satisfactorily mitigate stress.

It is preferable that a plurality of protruding portions 3a be formed symmetrically around the first opening hole 4a, and a plurality of protruding portions 3b be formed symmetrically around the second opening hole 4b to disperse the stress added to the connection portion, and thereby improve the connection strength between solar cells 1a and 1b and connection member 2.

As shown in FIG. 4B, the first opening hole 4a and the second opening hole 4b, thus a first through-hole and a second through-hole, range from the upper surface of connection member 2 to the lower surface of connection member 2 respectively. By providing the through-holes, the solder may be filled between connection member 2 and solar cells 1a and 1b via the through-holes in an easier manner compared to a case of filling the solder from a side surface of connection member 2. In addition, there is no particular limitation as long as the first and second opening holes are formed from a through-hole. The opening holes may have a circular shape or a quadrilateral shape to be described later in addition to an elliptical shape shown in the drawing.

When supplying the solder between solar cells 1a and 1b and connection member 2, as shown in FIG. 4B, a wire solder 5 is heated with heating unit 6 such as a laser, and then the solder may be supplied between the solar cells and the connection member. This is because the solder gets wet and spreads in a space between the cells and the connection member, which is secured by protruding portions 3 of the connection member, and thus a connection portion having a sufficient joining-layer thickness is formed.

It is preferable that the height of first protruding portion 3a and second protruding portion 3b be the same as the thickness of solder layer 5 from the viewpoint of connection reliability. This is because when the height of first protruding portion 3a and second protruding portion 3b is larger than the thickness of solder layer 5, a gap occurs between connection member 2 and solar cells 1a and 1b, and connection strength decreases. Specifically, it is preferable that the height of first protruding portion 3a and second protruding portion 3b be from 50 µm to 1 mm to secure an ideal joining-layer thickness, and thus suppress cracking of each solar cell.

It is preferable that connection member 2 be plated with tin or a tin-containing solder material. This is because when connection member 2 is plated with the tin or the tin-containing solder material, wettability with respect to the solder is improved, and thus a highly reliable connection portion, in which voids are less and the fillet is formed, is obtained. It is preferable that a core material of connection member 2 be formed from a metal, particularly, copper, or an alloy, particularly, a copper alloy. In addition, it is preferable that copper be annealed to have toughness. In a temperature cycle under a common use environment, stress that is applied to the connection portion is mitigated, and thus improvement of reliability may be expected.

The material of the connection member is not particularly limited as long as the material has high conductivity, but Cu, Ag, Au, Pt, Sn, alloys containing these, or the like may be used. In addition, a composite material with a resin material and a metal may be used. As the composite material of the resin material and the metal, for example, a material that is obtained by bonding a resin sheet and a connection member with an adhesive, or the like may be used. The above-described shape of the connection member of the solar cell illustrates only a typical example of the present invention.

Modification Example of Embodiment

As described above, the embodiment of the present invention was described, but it should be understood that the description and the drawings that construct a part of this disclosure do not limit the present invention. From this disclosure, various alternative embodiments, examples, and operation skills will be apparent to a person having ordinary skill in the art.

Figure 5A:
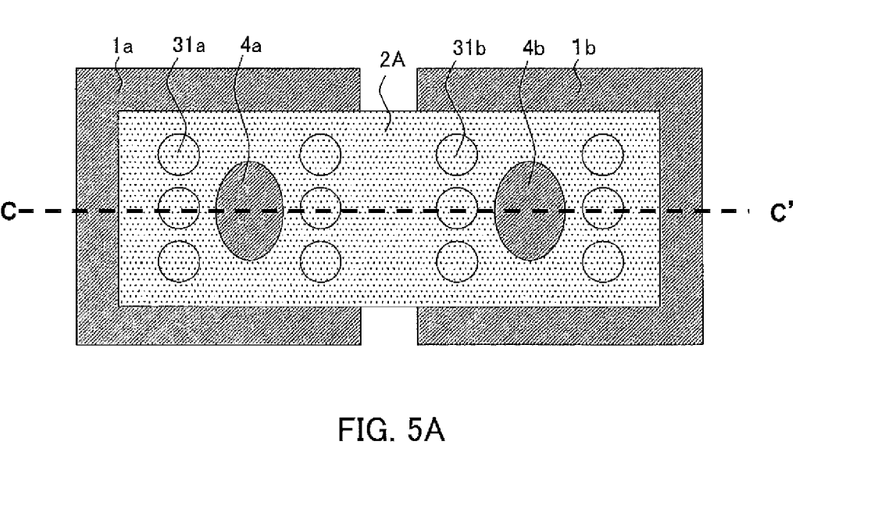
FIG. 5A is a top plan view illustrating a state in which the solder is filled in the connection portion of the solar cell module related to a modification example of the embodiment.
Figure 5B:
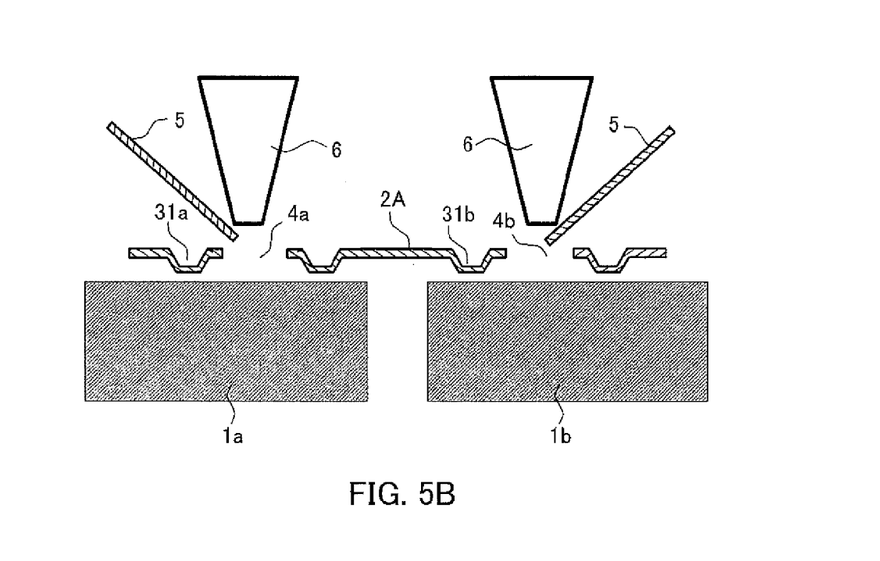
FIG. 5B is a cross-section view illustrating a state in which the solder is filled in the connection portion of the solar cell module related to the modification example of the embodiment.

For example, in the embodiment, as shown in FIG. 3, the shape of first and second protruding portions 3a and 3b is set to a quadrangular pyramid shape. However, the shape of first and second protruding portions 3a and 3b is not limited to this. For example, as shown in FIGS. 5A and 5B, the first and second protruding portions 31a and 31b, in which a surface, which comes into contact with the connection portion, of the protruding portion is set to a flat surface, are possible. Here, as an example thereof, connection member 2A having a mortar shape is illustrated.

When local stress is applied, there is a tendency for solar cell 1 formed from single crystal or polycrystal silicon to be significantly cracked. When connection member 2 is disposed on solar cell 1 and is joined thereto, a pressure is applied to solar cell 1 to press down connection member 2.

In protruding portion 3, which has a mortar shape, of the connection member, a contact area when connection member 2 and solar cell 1 come into contact with each other further increases compared to protruding portion 3, which has the quadrangular pyramid shape, of the connection member as shown in FIG. 1. Accordingly, stress that is applied to solar cell 1 is reduced, and thus cracking of the solar cell is suppressed.

Figure 6A:
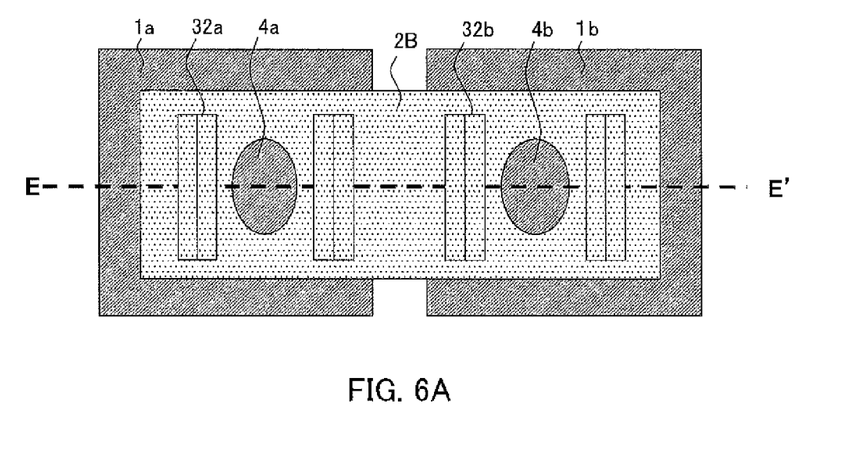
FIG. 6A is a top plan view illustrating a state in which the solder is filled in the connection portion of the solar cell module related to a modification example of the embodiment.
Figure 6B:
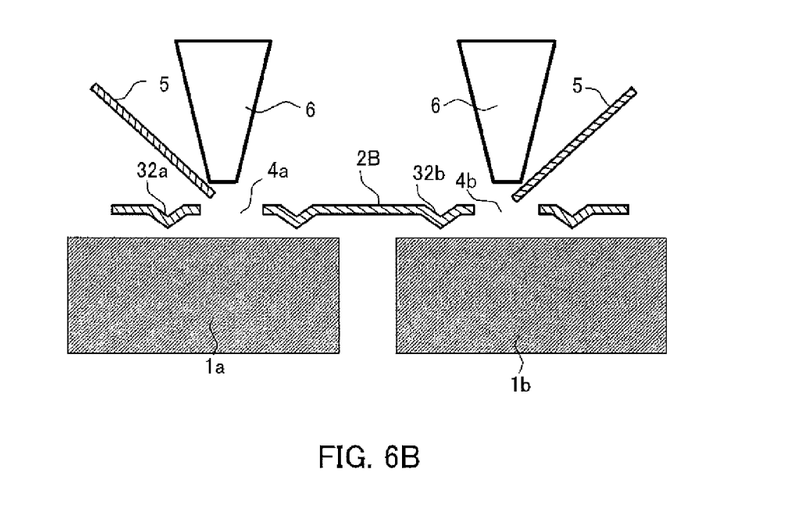
FIG. 6B is a cross-section view illustrating a state in which the solder is filled in the connection portion of the solar cell module related to the modification example of the embodiment.

In addition, with regard to a shape of first and second protruding portions 3a and 3b shown in FIG. 3, for example, first and second protruding portions 32a and 32b having a groove shape as shown in FIGS. 6A and 6B are also possible. By providing connection member 2B with first and second protruding portions 32a and 32b having the groove shape, wetting and spreading of the solder to a comb-shaped electrode portion including the P-type electrode and the N-type electrode is suppressed, and thus performance deterioration of the solar cell due to short-circuit of the P-type electrode and the N-type electrode may be suppressed.

Figure 7A:
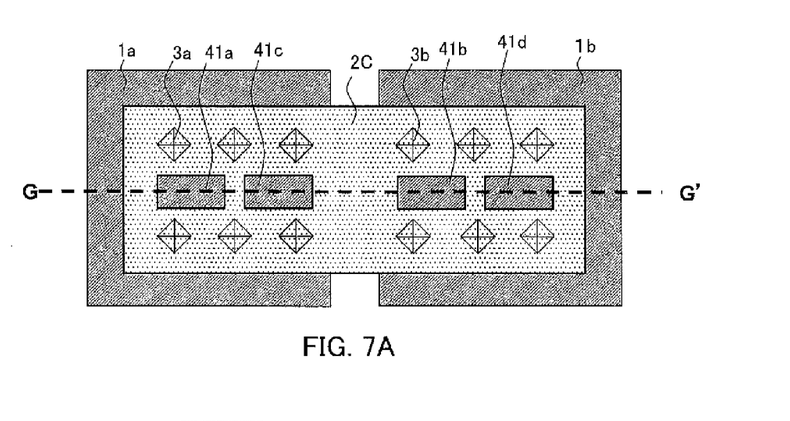
FIG. 7A is a top plan view illustrating a state in which the solder is filled in the connection portion of the solar cell module related to a modification example of the embodiment.
Figure 7B:
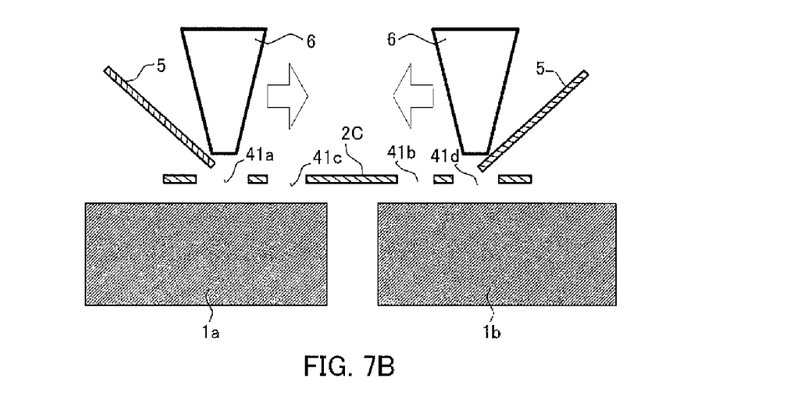
FIG. 7B is a cross-section view illustrating a state in which the solder is filled in the connection portion of the solar cell module related to the modification example of the embodiment.

Furthermore, as shown in FIGS. 7A and 7B, third opening hole 41c and fourth opening hole 41d may be formed along a longitudinal direction of connection member 2C to be arranged in a row with first and second opening holes 41a and 41b on a straight line. In addition, a shape of first opening hole 4a and second opening hole 4b of FIG. 3 is not limited to an elliptical shape, and may be a quadrilateral shape as shown in FIGS. 7A and 7B. In addition, the number of opening holes may be plural for one site of the connection portion. To secure wetting and spreading of the solder to the entirety of the connection portion, a plurality of the opening holes are formed, and wire solder 5 and heating unit 6 are scanned in an arrow direction of FIG. 7B. Accordingly, the wetting and spreading of the solder is secured regardless of the size of the connection portion, and thus the connection portion having high reliability may be accomplished.

In addition, the solder material that is used for the connection is not limited to the wired solder, and may be cream solder. The cream solder is applied to the center of the connection portion on a solar cell side. When the cream solder is interposed between the solar cell and the connection member, the cream solder functions as a cushion, and thus occurrence of cracking of the solar cell is suppressed during the joining. On the other hand, a flux content in the cream solder for application is approximately 13% in a weight ratio, and thus the flux content is approximately three or four times the flux content of approximately 3 to 4% in the wire solder.

A large amount of flux, which is scattered due to the heating during the solder joining, chemically reacts with the solar cell or a sealing material, and this becomes a cause of a decrease in module reliability. In addition, the scattered flux adheres to the inside of a production facility and thus a cleaning maintenance frequency increases, thereby leading to a decrease in productivity.

Next, description will be made using a configuration of protruding portion 3 other than the above-described configuration with reference to FIG. 8.

Figure 8:
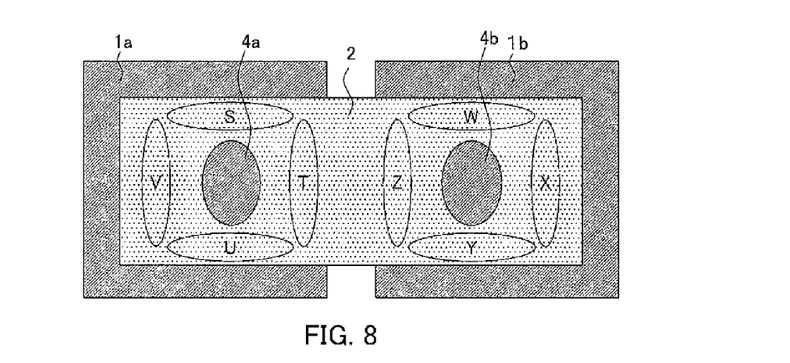
FIG. 8 is a top plan view of the connection portion of the solar cell module related to the modification example of the embodiment.

FIG. 8 illustrates a positional relationship between solar cell 1, protruding portion 3 of the connection member, and through-hole 4 of the connection member. Protruding portion 3 of the connection member is positioned at all sites indicated by "S", "T", "U", "V", "W", "X", "Y", and "Z", or at a part of the sites. In FIG. 5, when the protruding portion is positioned at the positions of "T" and "Z", it is easy for the solder to wet and spread at the entirety of the joint portion of solar cell 1 and connection member 2. The solder gets wet and spreads at an end face of connection member 2, and thus the fillet may be formed.

It becomes difficult for cracking extending to a solder joining layer due to the fillet, and thus an effect of improving the joining reliability is conceivable. In addition, when the fillet can be stably formed, fillet examination using a camera is applicable to examination of the connection portion, and thus examination in a process becomes easy. In addition, in FIG. 5, when protruding portion 3 of the connection member is present at "S", "V", "U", "W", "Z", and "Y", connection member 2 may be disposed on solar cell 1 in a relatively stable manner.

In addition, in FIG. 8, when protruding portion 3 of the connection member is present at "S", "V", "X", and "Y", connection member 2 may be stably disposed, and the fillet may be formed in each connection portion at an end face for each side. Furthermore, in FIG. 5, in a case where protruding portion 3 of the connection member is present at "S" and "Y", and in a case where protruding portion 3 of the connection member is present at "W" and "U", the same effect as the case in which protruding portion 3 of the connection member is present at "S", "V", "X", and "Y" may be expected. The number of the protruding portion of the connection member may be several as long as the number of the protruding portion of the connection member is one or more for one connection portion.

A module using this member is completed by the following processes. With regard to a configuration of the solar cell module, the solar cell is sealed with a sealing material, a glass plate of a protective member is mounted on a front surface side, and a resin film is mounted on a rear surface side as a protective member, whereby a laminated body is formed. In addition, an aluminum frame is mounted at the periphery of the laminated body.

As the sealing material that seals the solar cell, an adhesive synthetic resin is appropriately used, and for example, materials having a light-transmitting property such as ethylene vinyl acetate (EVA), transparent modified polyethylene, modified polypropylene, an acrylic resin, and a silicone resin may be used. Among these, EVA is appropriately used.

In addition, as the protective member that is provided on the surface side, glass is preferable in consideration of light transmittance or coefficient of thermal expansion. However, it is not limited thereto, and the protective member may be a member through which solar light transmits and which is capable of protecting the solar cell from an external force, a synthetic resin plate, or a film formed from a synthetic resin. When using the resin plate or the film, the weight of the module may be reduced. In the case of the synthetic resin or the film, for example, a plate or film formed from a polycarbonate resin, an acrylic resin, a vinyl chloride resin, a PET resin, a PVF resin, or the like may be used.

In addition, as the protective member that is provided on the rear surface side, the synthetic resin film is preferable when considering handability or lightness. However, it is not limited thereto as long as the protective member is capable of preventing invasion of moisture or foreign matters, and a glass plate, a synthetic resin plate, a metallic plate, a composite plate of a resin and a metal, or the like may be used.

Figure 9A:
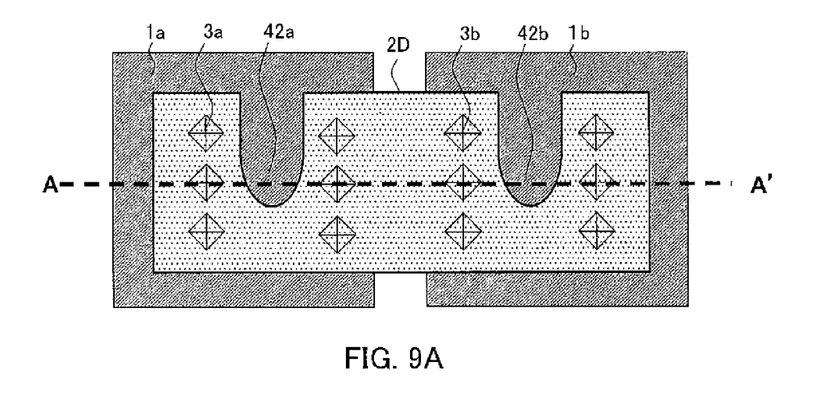
FIG. 9A is a top plan view illustrating a state in which the solder is filled in the connection portion of the solar cell module related to a modification example of the embodiment.
Figure 9B:
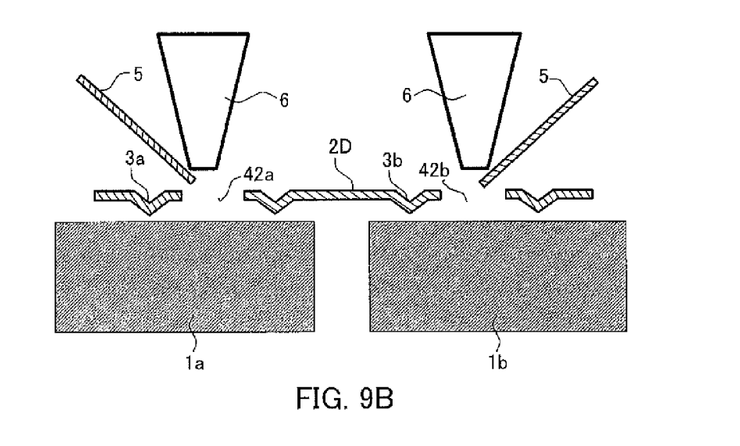
FIG. 9B is a cross-section view illustrating a state in which the solder is filled in the connection portion of the solar cell module related to the modification example of the embodiment.

Instead of the shape of first opening hole 4a and second opening hole 4b of FIG. 3, as shown in FIG. 9, first notch 42a and second notch 42b may be provided from one end of a long side of connection member 2D toward the center in a lateral direction of connection member 2D.

As described above, it should be understood that the present invention includes various embodiments that are not described here, and the like. Therefore, the technical scope of the present invention is determined by only invention-specifying matters related to the attached claims that are reasonable from the above description.

EXAMPLES

Figure 10:
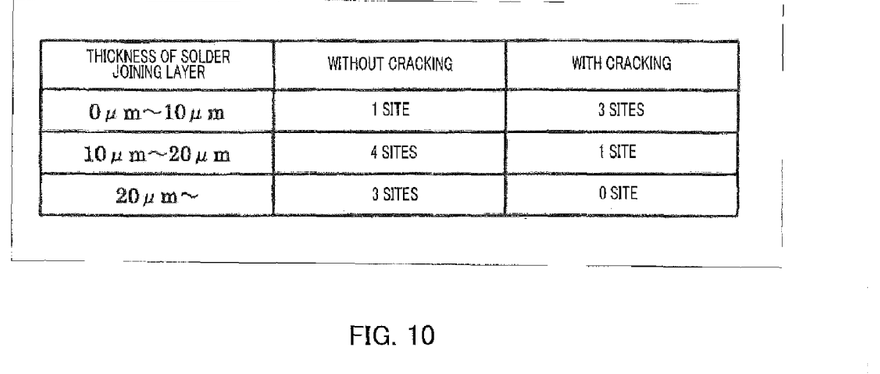
FIG. 10 is a view illustrating a correlation between the thickness of a solder joining layer and a cracking occurrence site after an acceleration test.

With regard to a correlation between the thickness of a solder joining layer and a cracking occurrence site after an acceleration test, an experiment of a temperature cycle test was performed. Obtained results are shown in FIG. 10.

As a test specimen, a plurality of solar cell modules including two solar cells as shown in FIG. 1 were prepared. A solder joining thickness of each test specimen was set to a solder joining thickness shown in FIG. 10.

Then, each of the test specimens was quickly heated from −40° C. to 90° C., and was quickly cooled from 90° C. to −40° C. after the heating. This process was set to one cycle, and 200 cycles were performed. This acceleration test is a temperature cycle test assuming use for approximately 10 years.

From results of this acceleration test, it can be seen that when the thickness of the solder joining layer is made large, there is a tendency for occurrence of cracking to be suppressed. In addition, to assure reliability of 20 years or more, it is important to suppress the occurrence of cracking in a test in which the number of cycles increases, and thus it is considered that the protruding portion of the connection member of 20 μm or more, and preferably 50 μm or more is necessary.

The present patent application claims priority from Japanese Patent Application that was previously applied by the present applicant, that is, Japanese Patent Application No. 2011-142559 (filed on Jun. 28, 2011), the disclosure of which is incorporated herein by reference.

INDUSTRIAL APPLICABILITY

As described above, since a connection portion having high reliability with a single crystal or polycrystal silicon solar cell is formed, the present invention is suitable for use as a connection member of a solar cell, and is also suitable for use as a connection member of a solar cell, in which reliability is required for long-term use of thin film silicon solar cell or the like.

REFERENCE SIGNS LIST

1a First solar cell
1b Second solar cell
2 Connection member
3a First protruding portion
3b Second protruding portion
4a First opening hole
4b Second opening hole
5 Solder layer (wire solder)
6 Heating unit

The invention claimed is:

1. A solar cell module comprising:
two or more solar cells that are adjacent to each other;
a connection member that electrically connects the two or more solar cells to each other at a same surface of the connection member; and
two or more solder layers that are respectively disposed between the two or more solar cells and the connection member,
wherein a first opening hole and a second opening hole are formed at a connection portion of the connection member corresponding to a first solar cell and a second solar cell of the two or more solar cells,
the first opening hole and the second opening hole are configured to have solder deposited therein,
the first opening hole and the second opening hole are formed along a central line in a longitudinal direction of the connection member, respectively,
the connection member includes a first protruding portion and a second protruding portion that protrude toward a surface of the first solar cell and a surface of the second solar cell, respectively,
the first protruding portion and the second protruding portion are formed at a part of the connection member outside each of the first opening hole and the second opening hole such that the first protruding portion and the second protruding portion avoid peripheral edges of the first opening hole and the second opening hole, and
a height of the first protruding portion and the second protruding portion is from 50 m to 1 mm.

2. The solar cell module according to claim 1, wherein the first opening hole and the second opening hole range from an upper surface of the connection member to a lower surface of the connection member, respectively.

3. The solar cell module according to claim 1, wherein a plurality of the first protruding portions are formed symmetrically around the first opening hole, and a plurality of the second protruding portions are formed symmetrically around the second opening hole.

4. The solar cell module according to claim 1, wherein the first protruding portion and the second protruding portion have a quadrangular pyramid shape.

5. The solar cell module according to claim 1, wherein the first protruding portion and the second protruding portions have a mortar shape.

6. The solar cell module according to claim 1, wherein the first protruding portion and the second protruding portions have a groove shape.

7. The solar cell module according to claim 1, wherein the connection member further comprises a third opening hole and a fourth opening hole that are formed along a longitudinal direction of the connection member and are arranged in a row with the first opening hole and the second opening hole to form a straight line.

8. The solar cell module according to claim 1, wherein the first opening hole and the second opening hole include notches formed from one end of a long side of the connection member toward a center of the connection member in a lateral direction of the connection member.

9. The solar cell module according to claim 1, wherein the height of the first protruding portion and the second protruding portion is the same as a thickness of the solder layer.

10. The solar cell module according to claim 1,
wherein the solar cell module includes a plurality of solar cell strings in which a plurality of the solar cells are arranged in a straight line, and
the plurality of solar cell strings are arranged in parallel with each other, and both ends of the solar cell strings, which are adjacent to each other, are electrically and mechanically connected to each other by a transition wiring.

11. The solar cell module according to claim 1, wherein in the two or more solder layers, a first solder layer is continuously formed to range from the first opening hole to the first protruding portion, and a second solder layer is continuously formed to range from the second opening hole to the second protruding portion.

12. The solder cell module according to claim 1,
wherein a first fillet of a first solder layer is formed in an area outside the connection member, the first solder layer is continuously formed to range from the first opening hole to the first fillet so as to be visibly protruding from beneath the connection member, and
a second fillet of a second solder layer is formed in an area outside the connection member, the second solder layer is continuously formed to range from the second opening hole to the second fillet so as to be visibly protruding from beneath the connection member.

13. The solder cell module according to claim 1, wherein the first protruding portion is formed between the first opening hole and a peripheral edge of the solder layer, and
the second protruding portion is formed between the second opening hole and the peripheral edge of the solder layer.

* * * * *